United States Patent [19]
Iwata et al.

[11] Patent Number: 6,149,729
[45] Date of Patent: Nov. 21, 2000

[54] FILM FORMING APPARATUS AND METHOD

[75] Inventors: Teruo Iwata, Nirasaki; Kazuichi Hayashi, Kofu; Yuichiro Fujikawa; Takashi Horiuchi, both of Yamanashi-ken, all of Japan

[73] Assignee: Tokyo Electron Limited, Tokyo, Japan

[21] Appl. No.: 09/080,718

[22] Filed: May 19, 1998

[30] Foreign Application Priority Data

May 22, 1997 [JP] Japan ..................................... 9-147049
Jun. 9, 1997 [JP] Japan ..................................... 9-164879

[51] Int. Cl.$^7$ .............................. C23C 16/00; B01D 53/04
[52] U.S. Cl. ....................... 118/715; 118/723 E; 55/312; 55/314
[58] Field of Search ................................. 118/723 E, 715, 118/506; 204/198.05, 198.06, 198.04; 425/223, 224; 264/165; 55/302, 738, 312, 314; 95/19, 132

[56] References Cited

U.S. PATENT DOCUMENTS 4,906,257 3/1990 Fukunaga et al. ......................... 55/57

FOREIGN PATENT DOCUMENTS 8-176829 7/1996 Japan .

OTHER PUBLICATIONS

A User's Guide to Vacuum Technology; O'Hanlon, J. F.; second edition, publisher: John Wiley & Son, 1989; chapter 19, p. 362, 1989.

*Primary Examiner*—Gregory Mills
*Assistant Examiner*—Parviz Hassanzadeh
*Attorney, Agent, or Firm*—Oblon, Spivak, McClelland, Maier & Neustadt, P.C.

[57] ABSTRACT

A film forming apparatus includes a chamber in which a thin film is formed on a semiconductor wafer by supplying a process gas, the interior of which is then cleaned by a cleaning gas, while the gas in the chamber is exhausted by a vacuum system. The vacuum system includes a main vacuum line connected to a vacuum port of the chamber, a high-vacuum pump arranged on an upstream side of the main vacuum line, a coarse control vacuum pump arranged on a downstream side of the main vacuum line, a bypass line which is connected to the main vacuum line so as to bypass the high-vacuum pump and has a first connection portion connected between the vacuum port and the high-vacuum pump and a second connection portion connected between the high-vacuum pump and the coarse control vacuum pump, a trap arranged on the bypass line, heater arranged between the first connection portion and the trap for heating gas flowing from the first connection portion to the trap, and valves for selectively opening/closing the main vacuum line and the bypass line to allow the gas in the chamber to flow through one of the lines.

17 Claims, 3 Drawing Sheets

FILM FORMING APPARATUS AND METHOD

BACKGROUND OF THE INVENTION

The present invention relates to a film forming apparatus and method for forming a thin film such as a thin Ti film within a chamber and, more particularly, to a film forming apparatus and method in which a cleaning gas is supplied in the chamber after film formation for cleaning the interior of the chamber.

In semiconductor devices, metal-based thin films are used for, e.g., a metal wiring layer, a buried layer which is buried in a contact hole serving as a connection portion between a lower device layer and an upper wiring layer, or a via hole serving as a connection portion between upper and lower wiring layers, the buried layer electrically connecting the layers, and a two-layered barrier layer which is formed to prevent diffusion of an impurity prior to formation of the buried layer and made up of a Ti (titanium) film and a TiN (titanium nitride) film.

Such a metal-based thin film is generally formed using physical vapor deposition (PVD). In recent years, micropatterning of devices and a high integration degree are particularly demanded, and the design rule particularly becomes severer. Along with this, the line width and the opening diameter of the hole become more smaller. In addition, as the aspect ratio increases, the Ti film and the TiN film constituting the barrier layer are becoming difficult to reliably form at the hole bottom by PVD films.

The Ti film and the TiN film constituting the barrier layer are therefore formed by chemical vapor deposition (CVD) which is expected to form a higher-quality film. In general, to form the Ti film by CVD, $TiCl_4$ (titanium tetrachloride) gas and $H_2$ (hydrogen) gas are used as a reaction gas. To form the TiN film, $TiCl_4$ gas, and $NH_3$ (ammonia) gas or MMH (monomethylhydrazine) gas are used as a reaction gas.

When a thin film like the one described above is formed by CVD, a film is deposited on a semiconductor wafer serving as a substrate subjected to film formation, and deposits also attach to the inner wall of a chamber. For this reason, the interior of the chamber must be cleaned prior to next film formation. Recently, in this cleaning, the chamber wall and a susceptor are heated while $ClF_3$ gas is introduced into the chamber to decompose the deposits, and the decomposition products are exhausted using a vacuum system with a vacuum pump.

If the $ClF_3$ gas is used, $TiF_4$ is produced as a by-product within the chamber, and the by-product attaches to the vacuum system. In the conventional method, therefore, as disclosed in Jpn. Pat. Appln. KOKAI Publication No. 8-176829, a portion of the vacuum system extending to the trap of a vacuum pipe is heated to a predetermined temperature to prevent $TiF_4$ from attaching to the interior of the vacuum system.

A high-vacuum pump such as a drag pump is arranged at the front stage up to the trap of the vacuum pipe. In heating the vacuum pipe, the high-vacuum pump is also heated. If the pump is heated to such a high temperature as to prevent $TiF_4$ from attaching, the rotor of the high-vacuum pump may be creep-ruptured.

To solve this problem, the trap may be arranged at the front stage of the high-vacuum pump to avoid the heating of the high-vacuum pump. By this method, however, the high-vacuum pump must have a large capacity, and vapor generated from the trap may influence the chamber.

BRIEF SUMMARY OF THE INVENTION

It is an object of the present invention to provide a film forming apparatus and method in which no problem accompanying processing of cleaning by-products occurs during exhaust in cleaning.

According to an aspect of the present invention, there is provided a film forming apparatus comprising, a chamber having a vacuum port to house a processing substrate, film forming means for supplying a film formation gas into the chamber to perform film formation processing for the processing substrate, cleaning means for supplying a cleaning gas into the chamber to clean an interior of the chamber, and vacuum means for exhausting gas from the chamber, the vacuum means having a main vacuum line connected to the vacuum port of the chamber, a high-vacuum pump arranged on an upstream side of the main vacuum line, a coarse control vacuum pump arranged on a downstream side of the main vacuum line, a bypass line which is connected to the main vacuum line so as to bypass the high-vacuum pump and has a first connection portion connected between the vacuum port and the high-vacuum pump and a second connection portion connected between the high-vacuum pump and the coarse control vacuum pump, a trap arranged on the bypass line, heating means arranged between the first connection portion and the trap, for heating gas flowing from the first connection portion to the trap, and switching means for selectively opening/closing the main vacuum line and the bypass line to allow the gas in the chamber to flow through one of the lines.

In the film forming apparatus having this arrangement, in film formation processing, the interior of the chamber can be evacuated by the high-vacuum pump through the main vacuum line. In cleaning processing, the interior of the chamber can be evacuated by the coarse control vacuum pump through the bypass line while the bypass line which bypasses the high-vacuum pump is heated to a predetermined temperature. Therefore, the cleaning by-products can be processed without influencing the main vacuum line, and problems resulting from processing of the cleaning by-products can be avoided.

When a titanium-contained gas is used as film formation gas, the interior of the chamber can be satisfactorily cleaned by using a fluorine-contained gas as a cleaning gas. At this time, titanium fluoride is produced as a by-product in the chamber. However, the interior of the chamber can be evacuated through the main vacuum line in film formation processing, and evacuated through the bypass line in cleaning processing while the bypass line is heated to a predetermined temperature, as described above. Therefore, titanium fluoride can be heated and processed without influencing the main vacuum line, and problems resulting from processing of the cleaning by-products can be avoided.

The high-vacuum pump is preferably arranged inside an outer wall surrounding the chamber, i.e., inside the apparatus main body. The coarse control vacuum pump and the trap are desirably arranged outside the outer wall, i.e., outside the apparatus main body. With this arrangement, only the portion outside the apparatus main body is removed in maintenance such as replacement of the trap, and good maintenance is attained. To remove only one portion of the vacuum system on the outlet side of the apparatus main body at this time, part of the main vacuum line and part of the bypass line are desirably shared.

According to another aspect of the present invention, there is provided a film forming apparatus comprising a chamber having a vacuum port to house a processing substrate, film forming means for supplying a film formation gas into the chamber to perform film formation processing for the processing substrate, cleaning means for supplying a cleaning gas into the chamber to clean an interior of the chamber, and vacuum means for exhausting gas from the chamber, the vacuum means having a main vacuum line connected to the vacuum port of the chamber, vacuum pump means arranged on the main vacuum line, a bypass line which bypasses part of the main vacuum line, switching means for selectively opening/closing the main vacuum line and the bypass line to allow the gas in the chamber to flow through one of the lines, a trap for capturing a product generated by the cleaning gas and flowing through the bypass line, connection means for detachably connecting the trap to the bypass line, means for allowing the vacuum pump means to evacuate an interior of the trap, filling means for filling a nitrogen gas or an inert gas in the evacuated trap, and sealing means for preventing the nitrogen gas or inert gas filled in the trap from escaping from the trap when the trap is removed from the bypass line.

According to the apparatus having this arrangement, even if the trap is removed from the bypass line to clean the trap, the main vacuum line can operate. Even if the apparatus is not made bulky, cleaning of the trap and film formation can be simultaneously performed to increase the throughput. In addition, upon removing the trap, no chemical reaction occurs in internal reaction products.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will be described in detail below with reference to the accompanying drawings.

Figure 1:
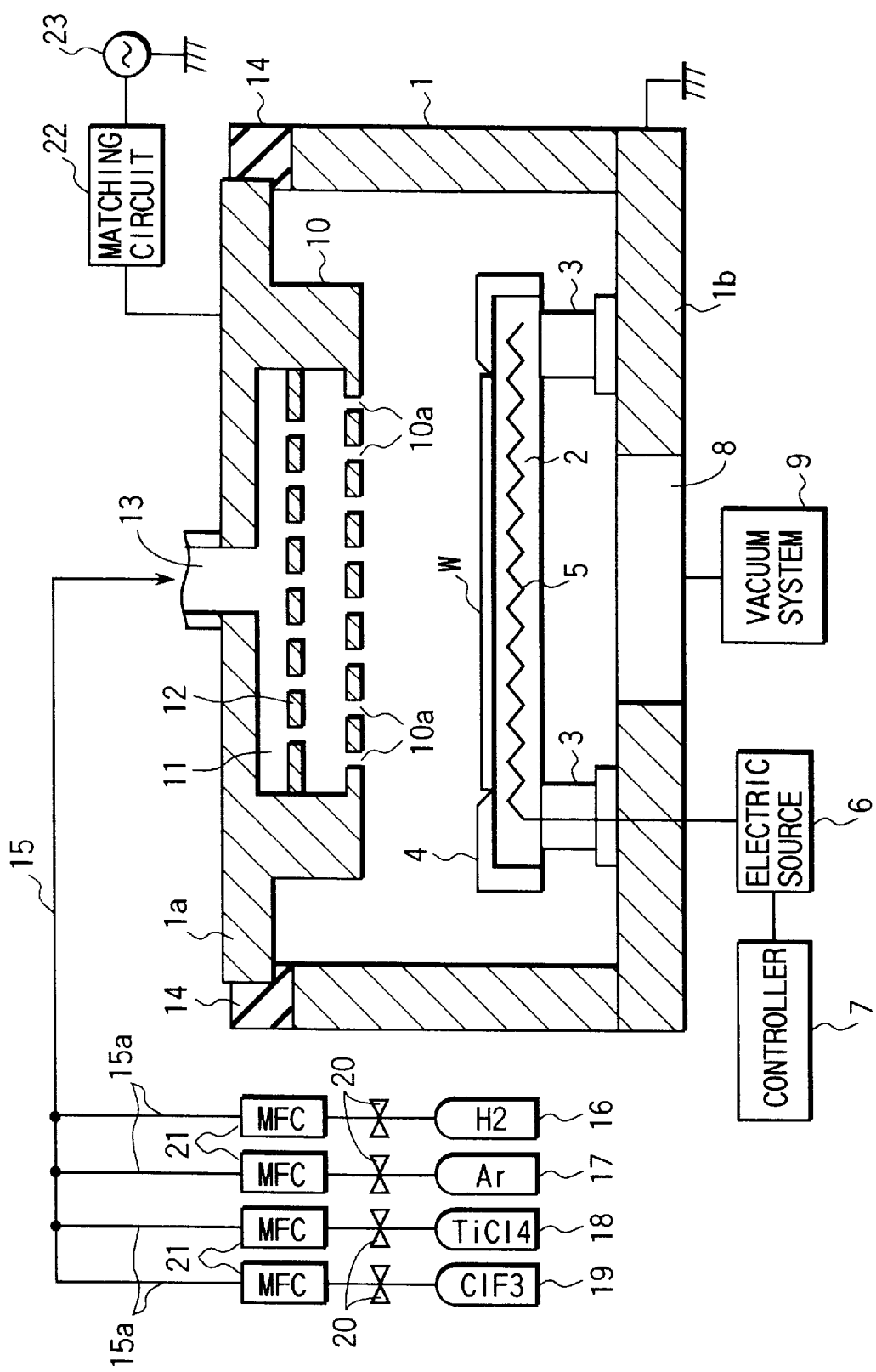
FIG. 1 is a sectional view showing a film forming apparatus according to an embodiment of the present invention.

FIG. 1 is a sectional view showing a CVD-Ti film forming apparatus according to an embodiment of the present invention. This film forming apparatus comprises an airtight chamber 1 having an almost cylindrical shape. In the chamber 1, a susceptor 2 for horizontally supporting a semiconductor wafer W serving as a processing object is supported by a cylindrical support member 3 having openings. A guide ring 4 for guiding the semiconductor wafer W is arranged at the outer peripheral edge portion of the susceptor 2. A heater 5 is buried in the susceptor 2 and receives power from an electric source 6 to heat the semiconductor wafer W serving as a processing object to a predetermined temperature. The electric source 6 is connected to a controller 7, which controls an output from the heater 5 in accordance with a signal from a temperature sensor (not shown).

A top wall 1a of the chamber 1 is made of a conductive material, e.g., aluminum. A shower head 10 is arranged on the top wall 1a so as to face the semiconductor wafer W supported by the susceptor 2 at a predetermined interval. Many gas spray holes 10a are formed in the lower wall of the shower head 10 that faces the wafer W. A space 11 is defined inside the shower head 10, and a diffusion plate 12 having many holes formed therein is horizontally arranged in the space 11. A gas inlet port 13 for introducing gas into the space 11 inside the shower head 10 is formed in the center of the top wall 1a of the chamber 1. A gas supply pipe 15 is connected to the gas inlet port 13.

An $H_2$ source 16, an Ar source 17, a $TiCl_4$ source 18, and a $ClF_3$ source 19 are respectively connected to the gas supply pipe 15 through branch pipes 15a. Desired gases are supplied from these gas sources into the chamber 1 through the gas supply pipe 15 and the shower head 10. In forming a film, $H_2$ gas, Ar gas, and $TiCl_4$ gas are respectively supplied from the $H_2$ source 16, the Ar source 17, and the $TiCl_4$ source 18 to form a Ti film on the semiconductor wafer W. In cleaning the interior of the chamber 1, $ClF_3$ gas is supplied from the $ClF_3$ source 19 into the chamber 1. A valve 20 and a mass-flow controller 21 are arranged on each branch pipe 15a extending from a corresponding gas source.

An RF electric source 23 is connected to the top wall 1a of the chamber 1 through a matching circuit 22, and RF power can be applied from the RF electric source 23 to the top wall 1a. By this RF power, a film formation gas plasma is formed in the chamber 1. The top wall 1a of the chamber 1 and the side wall of the chamber 1 are electrically insulated by an insulating member 14. The chamber 1 is grounded.

A vacuum port 8 is formed in a bottom wall 1b of the chamber 1. A vacuum system 9 for evacuating the interior of the chamber 1 is connected to the vacuum port 8 so as to be located outside the chamber 1.

Figure 2:
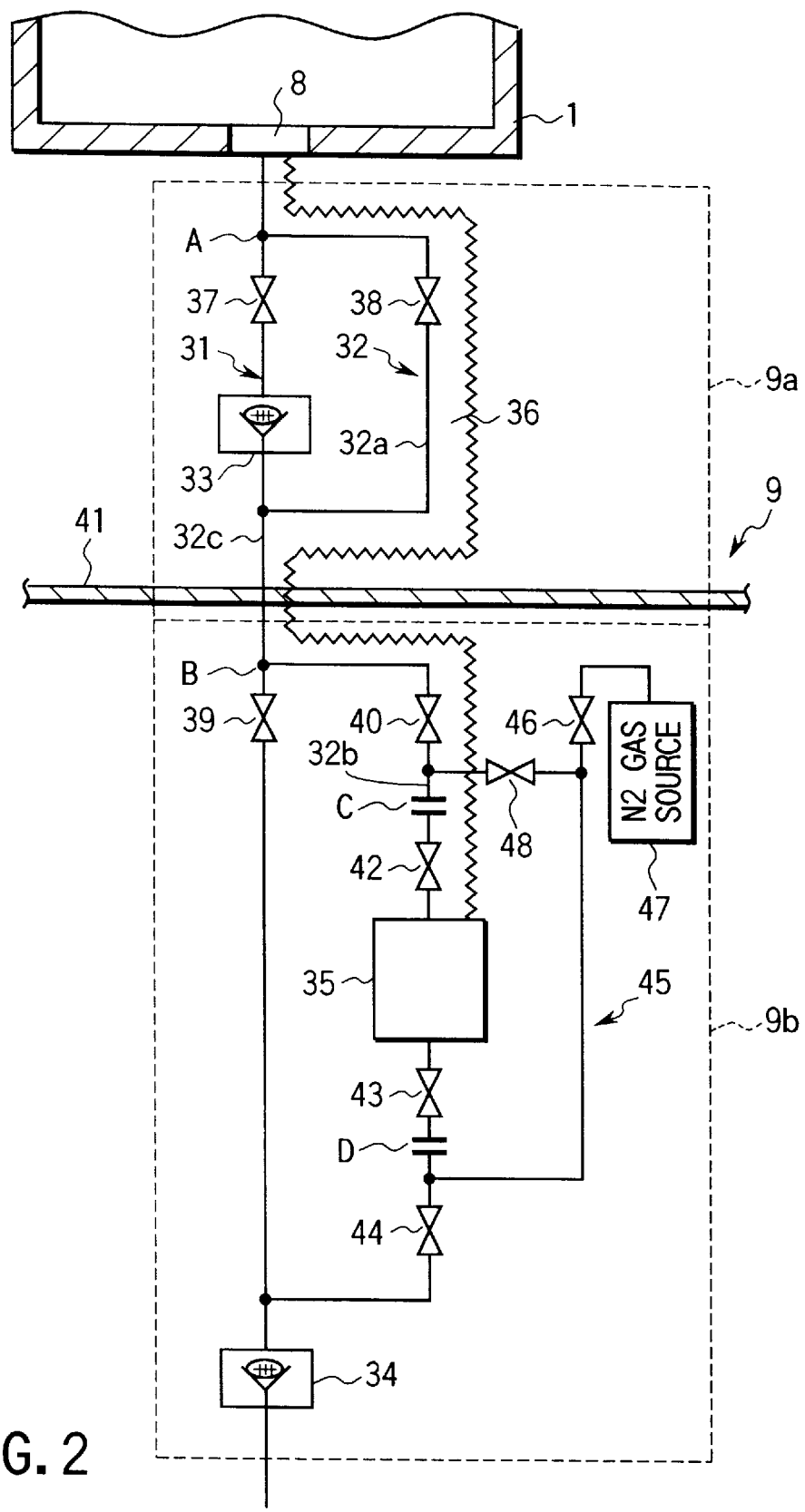
FIG. 2 is a view showing the vacuum system of the film forming apparatus in FIG. 1.

As shown in FIG. 2, the vacuum system 9 comprises a main vacuum line 31. The upstream side of the main vacuum line 31 is connected to the vacuum port 8 of the chamber 1. A high-vacuum pump 33 such as a drag pump or turbo molecular pump is arranged on the front stage of the main vacuum line 31, whereas a coarse control vacuum pump 34 such as a dry pump or rotary pump is arranged on the rear stage. The interior of the chamber 1 is coarsely evacuated by the dry pump 34 and further evacuated to a high vacuum by the drag pump 33.

A bypass line 32 branches from an upstream side portion (branch point or first connection portion A) of the drag pump 33 of the main vacuum line 31. The bypass line 32 bypasses the drag pump 33 and is connected to a front stage portion of the dry pump 34 of the main vacuum line 31, i.e., a portion (third connection portion) between these pumps 33 and 34. The bypass line 32 has a front stage portion 32a located inside the apparatus main body which houses the chamber 1, and a rear stage portion 32b located outside the apparatus main body. A trap 35 for capturing reaction products in gas is arranged at the rear stage portion 32b. A heating device 36 (in FIG. 2, simply represented by the wavy line and a detailed arrangement thereof will be omitted for the sake of simplicity) is arranged between a portion of the bypass line 32 up to the trap 35 and an upstream portion with respect to the branch point A of the main vacuum line 31. The heating device may be an electric heater surrounding the bypass line 32, a duct which is arranged coaxially with the bypass line outside it and through which a heating medium flows, or another proper means for heating a fluid flowing through the bypass line to the trap 35. In this embodiment, the heating device 36 is arranged up to the trap 35. However, since the bypass line is divided at the boundary of a removing portion C in order to remove the trap 35, as will be described later, the heating device 36 may be divided at the removing portion C or arranged only up to the removing portion C.

Near an outlet in an outer wall 41 of the apparatus main body, the front stage portion 32a of the bypass line 32 has a merging portion 32c at which the bypass line 32 merges with the main vacuum line 31 by the third connection portion to form one common pipe. The rear stage portion 32b branches from the main vacuum line 31 at a portion (branch point or fourth connection portion B) outside the outer wall of the apparatus main body, extends through the trap 35, and is connected to the main vacuum line 31 again near the inlet of the dry pump 34, i.e., at the second connection portion. In the vacuum system 9, a front stage vacuum system 9a having the drag pump 33 is arranged inside the apparatus main body, and a rear stage vacuum system 9b having the dry pump 34 and the trap 35 is arranged outside the apparatus main body.

The portion of the main vacuum line 31 inside the apparatus main body and the portion outside the apparatus main body are detachably connected on the outer wall 41 of the apparatus main body. For this connection, a well-known means such as a joint coupler for connecting pipes is available. As a result, for example, when the trap 35 is to be removed from the vacuum system 9 for the purpose of maintenance, and to be remounted on it, the trap 35 can be separated at a portion of the main vacuum line 31 on the outer wall 41.

Opening/closing valves 37 and 38 are respectively arranged on the downstream sides of the main vacuum line 31 and the bypass line 32 near the branch point A. Opening/closing valves 39 and 40 are respectively arranged on the downstream sides near the branch point B. By selectively opening/closing these valves, the vacuum path can be switched between the main vacuum line 31 side and the bypass line 32 side. In performing film formation processing for the semiconductor wafer W in the chamber 1, the valves 37 and 39 are opened, and the valves 38 and 40 are closed to evacuate the interior of the chamber 1 to a predetermined vacuum degree by the dry pump 34 and the drag pump 33 through the main vacuum line 31. In performing cleaning processing, the valves 37 and 39 are closed, and the valves 38 and 40 are opened to evacuate the interior of the chamber 1 by only the dry pump 34 through the bypass line 32 while the bypass line 32 is heated by the heating device 36. These valves are switched manually or automatically by a controller (not shown).

Opening/closing valves 42 and 43 are respectively arranged on the upstream and downstream sides near the trap 35. If these valves 42 and 43 are closed after the interior of the trap 35 is evacuated by the dry pump, the trap 35 can be maintained in vacuum.

The removing portion C and a removing portion D are respectively formed on the upstream and downstream sides near the valves 42 and 43. The trap 35 can be detached from the vacuum system 9 by these removing portions. The removing portions C and D are not particularly limited as far as they can detachably, airtightly connect the two ends of a pipe having the trap 35 and the valves 42 and 43 to corresponding ends of pipes on the upstream and downstream sides. For example, joint couplers can be used for the removing portions C and D. An opening/closing valve 44 is arranged at the rear stage portion 32b of the bypass line so as to be located between the dry pump 34 and the removing portion D.

The vacuum system 9 comprises a gas supply line 45 having one end connected between the valve 40 and the removing portion C, and the other end connected between the valve 44 and the removing portion D. The gas supply line 45 has an opening/closing valve 48 and is connected to an $N_2$ steel gas cylinder or gas supply source 47 through an opening/closing valve 46. The steel gas cylinder 47 can selectively supply $N_2$ gas to the line 45. Instead of the $N_2$ steel gas cylinder 47, an inert gas source such as an Ar gas source is available. Although not shown, a pressure monitoring sensor is installed at a pipe portion between respective valves. When the pressure becomes abnormal, the sensor can detect it.

In the apparatus having this arrangement, the semiconductor wafer W is first loaded into the chamber 1. While the wafer W is heated to a temperature of, e.g., 450 to 600° C. by the heater 5, the valves 37 and 39 of the vacuum system 9 are opened, and the valves 38, 40, and 46 are closed to switch the vacuum path to the main vacuum line 31 side. In this state, the interior of the chamber 1 is evacuated and kept in a high-vacuum state by the dry pump 34 and the drag pump 33. The interior of the chamber 1 is set to, e.g., 0.1 to 1 Torr, and Ar gas, $H_2$ gas, and $TiCl_4$ gas are respectively preflowed at predetermined flow rates for about 5 to 20 sec. These gases flow under the same conditions to form a Ti film on the semiconductor wafer within a predetermined time. Upon completion of the film formation, the semiconductor wafer W is unloaded from the chamber 1.

In this film formation, Ti is also deposited on the inner surface of the chamber 1 and the outer surface of the susceptor 2. For this reason, after the film formation, the interior of the chamber 1 is cleaned. In this cleaning, the supply of $TiCl_4$ gas and $H_2$ gas for film formation is stopped, and $ClF_3$ gas is supplied to the chamber 1. At this time, the susceptor 2 and the chamber wall are respectively heated to, e.g., about 300° C. by the heater 5 of the susceptor 2 and a heater (not shown) arranged on the wall portion of the chamber. Since $ClF_3$ is highly reactive, it produces, by only this heating, titanium tetrafluoride ($TiF_4$) which reacts with Ti and gasifies at a predetermined temperature or more. This product can be exhausted outside the chamber by the vacuum system 9. That is, using $ClF_3$ gas as cleaning gas enables plasma-less cleaning, and the cleaning can be very easily performed.

In this case, the valves 37 and 39 of the main vacuum line 31 and the valve 48 of the gas supply line 45 are closed, and the valves 38, 40, 42, 43, and 44 of the bypass line 32 are opened to switch the vacuum path to the bypass line 32 side. In this state, a portion between the portion of the bypass line 32 up to the trap 35 and the upstream portion with respect to the branch point A of the main vacuum line 31 is heated by the heating device 36 to a $TiF_4$ gasification temperature or more to prevent attachment of $TiF_4$. Meanwhile, the interior of the chamber 1 is evacuated by only the drag pump 34 through the bypass line 32. Consequently, $TiF_4$ in the exhaust gas guided by the bypass line 32 is captured by the trap 35.

For maintenance of the trap 35, while the valves 37, 38, 40, and 42 are closed, and the valves 43 and 44 are opened, the dry pump 34 is operated to evacuate the interior of the trap 35 and set it in a low-pressure state. Then, the valves 43 and 44 are closed to vacuum-seal the trap 35. Next, the valves 46, 48 of the gas supply line 45 are opened to supply $N_2$ gas from the $N_2$ gas source 47 to the pipe portion between the valves 40 and 42 and the pipe portion between the valves 43 and 44, and to change these portions to atmospheric pressure. At atmospheric pressure, the trap 35 is removed from the vacuum system 9 at the removing portions C and D together with the closed valves 42 and 43. Since the trap 35 removed in this manner is vacuum-sealed, no chemical reaction occurs in the inner reaction products. The trap 35 in this state is safely conveyed to a maintenance location, purged with $N_2$, washed, and mounted on the vacuum system 9 again.

To form a film again, when the valves 43 and 44 are closed to vacuum-seal the trap 35, the valves 37 and 39 of the main vacuum line 31 can be opened to perform a vacuum operation by the main vacuum line 31. Therefore, film formation processing can be simultaneously performed at the same time as the maintenance of the trap 35. This is very efficient in the film formation process.

As described above, since exhaust in cleaning is performed by the bypass line 32, $TiF_4$ as cleaning by-product gas can be processed without influencing the main vacuum line 31. Creep rupture of the rotor upon heating of the drag pump, an increase in capacity of the drag pump, and the influence of vapor generated from the trap on the chamber can be avoided.

Of the vacuum system 9, the drag pump 33 is arranged inside the apparatus main body, and the dry pump 34 and the trap 35 are arranged outside the apparatus main body. In maintenance such as replacement of the trap 35, only the portion outside the apparatus main body is removed, and good maintenance is attained.

At the outlet in the outer wall 41 of the apparatus main body, the bypass line 32 has the merging portion 32c at which the bypass line 32 merges with the main vacuum line 31 to form one common pipe portion. The bypass line 32 branches from the main vacuum line 31 again at the portion (branch point B) outside the apparatus main body. The portion of the vacuum system 9 outside the apparatus main body can be removed at the merging portion 32c. In maintenance such as replacement of the trap 35, the trap 35 is removed at only one portion of the outlet of the apparatus main body, and better maintenance can be obtained.

Note that the present invention is not limited to the above embodiment and can be variously changed. For example, the above embodiment has exemplified the case wherein the Ti film is formed by CVD, and cleaning is performed using $ClF_3$ gas. However, the type of film formation and the type of cleaning gas are not limited to them. Although attachment to the vacuum system does not pose a problem in film formation, the present invention is particularly effective when cleaning by-products attaching to the vacuum system in cleaning are generated.

Figure 3:
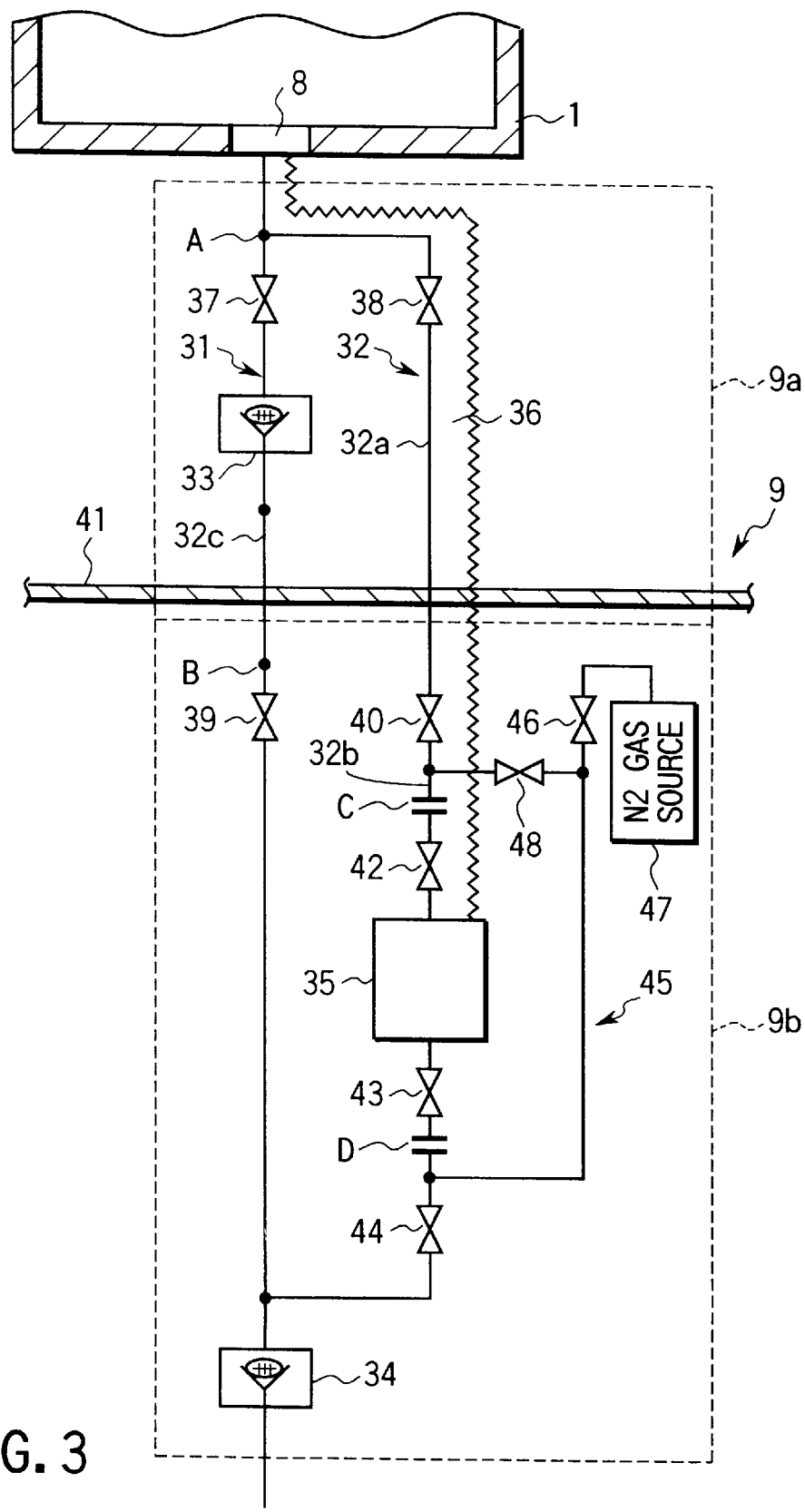
FIG. 3 is a view showing another embodiment of the vacuum system.

In the above embodiment, the bypass line 32 and the main vacuum line 31 merge with each other to form one pipe at the outlet of the apparatus main body. The present invention is not limited to this. As shown in FIG. 3, the bypass line 32 may be realized by one pipe, and the vacuum path may be switched by only the valves 37 and 38. In this embodiment, the remaining arrangement is substantially the same as that in FIG. 2, and a description thereof will be omitted. The processing substrate is not limited to the semiconductor wafer and may be an LCD substrate and the like. In addition, another layer may be formed on the substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film forming apparatus comprising:
   a chamber having a vacuum port to house a processing substrate;
   a film forming device for supplying a film formation gas into said chamber to perform film formation processing for said processing substrate;
   a cleaning device for supplying a cleaning gas into said chamber to clean an interior of said chamber;
   a vacuum device for exhausting gas from said chamber, said vacuum device having a main vacuum line connected to the vacuum port of said chamber, a high-vacuum pump arranged on an upstream side of said main vacuum line, a coarse control vacuum pump arranged on a downstream side of said main vacuum line, a gas bypass line which is connected to said main vacuum line so as to bypass said high-vacuum pump and which has a first connection portion connected between the vacuum port and said high-vacuum pump and a second connection portion connected between said high-vacuum pump and said coarse control vacuum pump, a trap arranged on said bypass line for capturing the gas, a heater, arranged between the first connection portion and said trap, for heating gas flowing from the first connection portion to said trap, and a switching device for selectively opening/closing said main vacuum line and said bypass line to allow the gas in said chamber to flow through one of said lines:
   a removing portion provided on the bypass line, in which the trap is provided, so that the trap is removable from the bypass line and said removing portion;
   a device for supplying a nitrogen gas or an inert gas in said removing portion; and
   a device provided on the bypass line for preventing the nitrogen gas or inert gas from entering into said trap through said removing portion.

2. The apparatus as claimed in claim 1, wherein said at least one removing portion comprises first and second removing portions between which said trap is provided.

3. An apparatus according to claim 1, wherein said film forming device comprises a film formation gas supply system for supplying a titanium-contained gas into said chamber, and said cleaning device comprises a cleaning gas supply system for supplying a fluorine-contained gas into said chamber.

4. An apparatus according to claim 1, wherein said high-vacuum pump comprises one of a drag pump and a turbo molecular pump, and said coarse control vacuum pump comprises one of a dry pump and a rotary pump.

5. An apparatus according to claim 1, further comprising an outer wall surrounding said chamber, and
   wherein said high-vacuum pump is arranged inside said outer wall, and said coarse control vacuum pump and said trap are arranged outside said outer wall.

6. An apparatus according to claim 1, wherein said bypass line comprises a third connection portion connected between said high-vacuum pump and the second connection portion of said main vacuum line and a fourth connection portion connected between the third and second connection portions of said main vacuum line, and the third and fourth connection portions are connected by a portion of said main vacuum line located between the third and fourth connection portions.

7. An apparatus according to claim 6, wherein the portion of said main vacuum line located between the third and fourth connection portions has a first section located inside said outer wall and a second section located outside said outer wall to be detachable from the first section.

8. An apparatus according to claim 1, wherein said heating device substantially extends through said bypass line between the first connection portion and said trap.

9. A film forming apparatus comprising:
   a chamber having a vacuum port to house a processing substrate;
   a film forming device for supplying a film formation gas into said chamber to perform film formation processing for said processing substrate;
   a cleaning device for supplying a cleaning gas into said chamber to clean an interior of said chamber; and
   a vacuum device for exhausting gas from said chamber, said vacuum device having a main vacuum line connected to the vacuum port of said chamber, a vacuum pump arranged on said main vacuum line, a bypass line which bypasses part of said main vacuum line, a switching device for selectively opening/closing said main vacuum line and said bypass line to allow the gas in said chamber to flow through one of said lines, a trap for capturing a product generated by the cleaning gas and flowing through said bypass line, a connection device for detachably connecting said trap to said bypass line,
   first and second removing portions provided on the bypass line, between which the trap is provided, so that the trap is removable from the bypass line at said removing portions;
   a device for supplying a nitrogen gas or an inert gas to the removing portion; and
   a device provided on the bypass line for preventing the nitrogen gas or inert gas from entering into said trap through the removing portions.

10. An apparatus according to claim 9, wherein said filling device comprises a nitrogen or inert gas source, a gas supply line for connecting said nitrogen or inert gas source to said bypass line, and a gas supply opening/closing valve arranged on said gas supply line.

11. An apparatus according to claim 10, wherein said gas supply line has a first connection portion connected to said bypass line on an upstream side of said trap and a second connection portion connected to said bypass line on a downstream side of said trap, said sealing device comprises a first opening/closing valve arranged on said bypass line between the first connection portion and said trap and a second opening/closing valve arranged on said bypass line between the second connection portion and said trap, the nitrogen gas is supplied from said nitrogen gas source by opening said first valve and closing said second valve when said gas supply valve is opened, and said first and second opening/closing valves are closed when said trap is removed from said bypass line.

12. An apparatus according to claim 11, wherein said connection device comprises a first coupler arranged on said bypass line between the first connection portion and said first opening/closing valve and a second coupler arranged on said bypass line between the second connection portion and said second opening/closing valve.

13. A film forming apparatus comprising:
    a chamber having a vacuum port to house a processing substrate;
    a film forming device for supplying a film formation gas into said chamber to perform film formation processing for said processing substrate;
    a cleaning device for supplying a cleaning gas into said chamber to clean an interior of said chambers;
    a vacuum device for exhausting gas from said chamber;
    said vacuum device having a main vacuum line connected to the vacuum port of said chamber, a high-vacuum pump arranged on an upstream side of said main vacuum line, a coarse control vacuum pump arranged on a downstream side of said main vacuum line, a gas bypass line which is connected to said main vacuum line so as to bypass that high-vacuum pump and which has a first connection portion connected between the vacuum port and said high-vacuum pump and a second connection portion connected between said high-vacuum pump and said coarse control vacuum pump, a trap arranged on said bypass line for capturing the gas, a heater, arranged between the first connection portion at said trap, for heating gas flowing from the first connection portion to said trap, and a switching device for selectively opening/closing said main vacuum line and said bypass line to allow the gas in said chamber to flow through one of said lines;
    first and second removing portions provided on said bypass line, between which the trap is provided, so that the trap is removable from the bypass line at said removing portions;
    a device for supplying nitrogen or an inert gas in said removing portions; and
    a device provided on the bypass line for preventing the nitrogen gas or inert gas from entering into said trap through said removing portions.

14. An apparatus according to claim 13, wherein said preventing device includes a first valve located between said trap and said first removing device, and a second valve located between said trap and said second removing device.

15. An apparatus according to claim 14, wherein said first and second valves seal the trap in a vacuum state when said trap is removable from the bypass line.

16. A method of forming a film, comprising the steps of:
    performing film formation processing for a processing substrate by supplying film formation gas into a chamber;
    performing cleaning processing by supplying a cleaning gas into said chamber after the film formation processing;
    evacuating an interior of said chamber by a vacuum pump through a main vacuum line during the film formation step;
    evacuating the interior of said chamber during the cleaning step through a bypass line which bypasses said vacuum pump and which has a removing portion and a trap;
    heating gas flowing through said bypass line during the cleaning steps;
    filling said removing portion with nitrogen gas or an inert gas after the cleaning step;
    removing said trap from said bypass line; and
    cleaning said trap.

17. A method as claimed in claim 16, wherein said gas comprises a nitrogen gas.

* * * * *